March 12, 1963

H. H. ADELAAR 3,081,409

PULSE DELAY CIRCUIT

Filed Jan. 10, 1958

2 Sheets-Sheet 1

Inventor
H. H. Adelaar
By John M. Calimafde
Attorney

March 12, 1963 H. H. ADELAAR 3,081,409

PULSE DELAY CIRCUIT

Filed Jan. 10, 1958 2 Sheets-Sheet 2

Inventor
H. H. Adelaar
By John M. Calimafde
Attorney

United States Patent Office 3,081,409

Patented Mar. 12, 1963

3,081,409

PULSE DELAY CIRCUIT

Hans Helmut Adelaar, Antwerp, Belgium, assignor to International Standard Electric Corporation, New York, N.Y., a corporation of Delaware Filed Jan. 10, 1958, Ser. No. 708,253
Claims priority, application Netherlands Feb. 9, 1957
7 Claims. (Cl. 307—108)

The present invention relates to delay circuits such as are used extensively in pulse time switching and telecommunication circuits, control circuits, computer circuits and the like, to provide for short-term memory in marking or priming, where the sequential occurrence of a number of events must be controlled.

A static delay device of simple construction capable of retaining a signal during a certain time between two well determined limits may be envisaged.

In known electronic circuits, there are often used delay arrangements utilising the time constant of circuits including certain elements such as capacitors. However, such delay arrangements have the drawbacks that they do not provide a steep edge impulse at the end of their period of delay unless they are associated with active elements, such as electronic tubes.

Another known circuit is a delay line, either of the continuously wound helical, or of the lumped constant type. Such a delay line, besides being rather costly and of considerable physical dimensions, cannot adequately be made for delays exceeding a few microseconds.

It is an object of the invention to provide a delay circuit for priming purposes or the like, which produces, in response to a pulse wave form applied to the input, an output pulse substantially rectangular in form and persisting a predetermined time after the input pulse has ceased, wherewith said time of persistence may be extended beyond the microsecond region, and is generally of the same order as the width of the input pulse (e.g. 0.1 msec.), and is capable of producing steep edge output pulses without association with active elements.

It is another object of the invention to provide such a circuit which is very simple, cheap, and which occupies minimum space.

Saturable reactors and saturable capacitors are devices, respectively having cores and dielectrics of so-called ferromagnetic and ferroelectric material.

Ferromagnetic material has a more or less rectangular hysteresis loop representing the relation between magnetic field strength H and magnetic induction B. The loop has a relatively steep part where the permeability is high between two parts of very low slope where the permeability is very low. With permalloy and similar ferromagnetic alloys, the width of the loop is very small. The hysteresis loop for ferromagnetic purposes is generally regarded as three straight lines, an intermediate line of high slope through the origin, and lines at each end thereof of very low slope (FIG. 1), and this is used to indicate the use of a saturable ferromagnetic core.

Ferroelectric material such as barium titanate crystals have a similar hysteresis loop representing the relation between electric field strength and dielectric displacement.

In a saturable reactor having a ferromagnetic core, a similar three-line curve represents the relation between magnetising current (horizontal) and flux linkage (vertical).

In a saturable capacitor having a ferroelectric dielectric, a similar three-line curve represents the relation between capacitor voltage (horizontal) and charge (vertical).

Circuits having resistance, capacity, and inductance in which a saturable reactor or a saturable capacitor is used have the characteristic known as ferroresonance, or more particularly ferromagnetic resonance and ferroelectric resonance. In the two cases, the relation between voltage and current is reversed, the curves being similar.

The curve between current and voltage of such a circuit is shown in FIG. 2.

When ferromagnetic resonance is used, the relation is as follows. As voltage increases from zero, current increases in a smooth relation until point *a* in the curve is reached, at which point the current suddenly jumps to point *b*, after which it increases smoothly with voltage towards *c*.

If the voltage is now decreased, the current will decrease smoothly from *c* through *b* towards *d*. At *d* the current will suddenly jump down to *e* thereafter falling smoothly along the curve to zero.

This is a well-known phenomenon.

In the case of ferroelectric resonance, the roles of voltage and current are reversed, the current being the ordinate and changing smoothly while the voltage is the abscissa and exhibits the jumps from *a* to *b*, and *d* to *e*.

Such circuits have been used in various ways including proposals where the phenomenon has been incorporated in complex circuits via which trains of pulses have been transmitted.

The object of the invention is to utilise the phenomenon in a simple manner for a new purpose and in a novel manner by means of which pulse trains can be received and retransmitted in rectangular form but with a predetermined time delay.

The invention is not however limited in its scope to its application to rectangular pulse transmission as delay can be introduced into the transmission of other wave forms by the same means.

The invention consists in an electrical delay circuit for delaying the transmission of electrical intelligence comprising an inductor device and a capacitor device effectively in series in a circuit also including resistance, one of said devices being of the saturable type.

The invention will now be described with reference to certain embodiments shown in the accompanying drawings in which:

FIG. 8, shows a variant of FIG. 7, while

Figures 1, 2, 3:
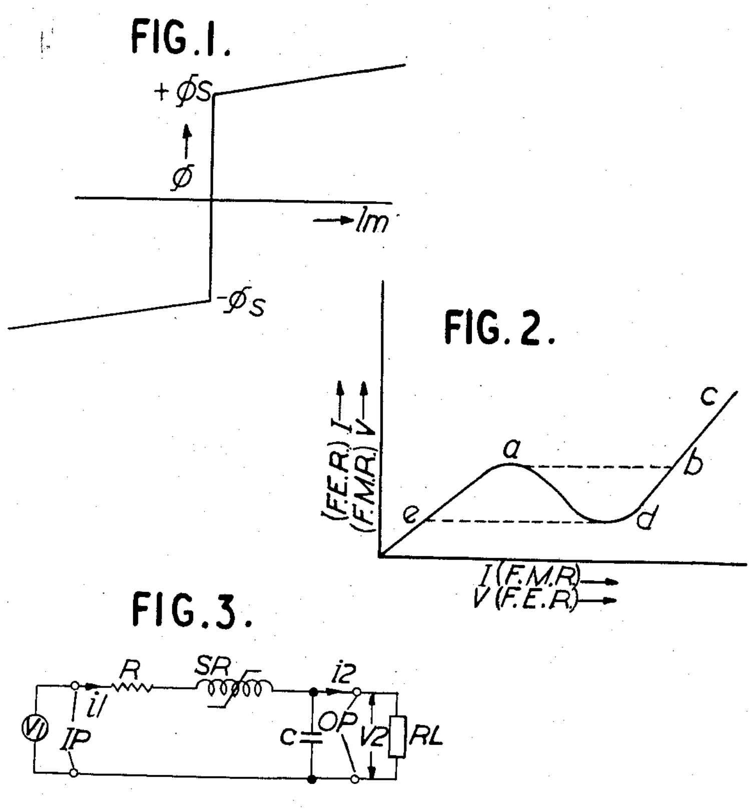
FIG. 1, shows the flux versus magnetising current curve for ferromagnetic material, and by analogy charge versus capacitor voltage for ferroelectric material.
FIG. 2, is a curve showing voltage/versus current for a ferromagnetic saturable reactor and current/versus voltage for a ferroelectric saturable capacitor.
FIG. 3, shows a delay circuit utilising a ferromagnetic saturable reactor.
Figure 4:
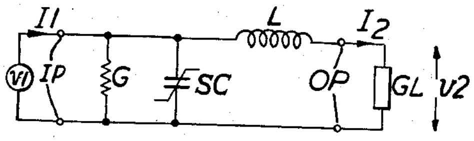
FIG. 4, shows a delay circuit utilising a ferroelectric saturable capacitor.

Two alternative delay devices utilising ferromagnetic resonance and ferroelectric resonance respectively are shown in FIGS. 3 and 4.

FIG. 3 comprises a two-terminal input IP across which electrical waveforms to be transmitted are applied. In one wire of the two-wire circuit are included a resistor R and a saturable reactor SR. Across the two wires is connected a capacitor C. A two-terminal output is connected across the capacitor C and is shown as being connected to a load RL.

The input to IP is shown as a voltage source V1 and the current in the input side of the circuit is indicated as $i1$. The output voltage is indicated as V2 and the output current as $i2$.

FIG. 4 comprises a two-terminal input IP and a two-wire output OP. Corresponding terminals of the input and output are interconnected via an inductance L and by a direct wire connection respectively. Between the two interconnections and on the input side of the inductance L a saturable capacitor SC and a resistor G are connected in parallel. A load GL is shown connected to the output OP.

Input voltage and current are indicated as I1, $v1$, and output voltage and current as I2, $v2$.

Figure 7:
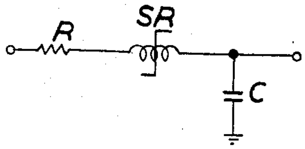
FIG. 7, shows an alternative circuit to that of FIG. 3.

In both cases the two terminal inputs and outputs can be replaced by single terminals, the cross-connected capacitors and resistors being tied on a single wire circuit to earth as shown in FIG. 7 for a saturable reactor.

In FIG. 1 is shown flux $\Phi$ versus magnetisation current $im$, flux being proportional to B and current to H in the hysteresis curve. The high slope corresponds with infinite inductance and zero admittance, the low slope with low self inductance and high admittance.

Figure 6:
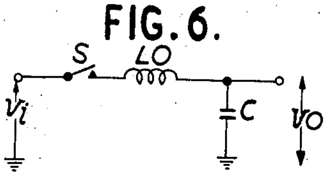
FIG. 6, shows an equivalent theoretical circuit for an element having the curve of FIG. 1.

An element with such a flux versus magnetisation curve may be simulated as shown in FIG. 6, by an air coil of relatively very small self inductance $L_0$ in series with a switch S, which will be closed at the moment the real coil reaches saturation, and opened again, as soon as the magnetising current drops to zero.

Referring again to FIG. 3, suppose the core is at its negative saturation point, i.e. the flux is $-\Phi_s$, and the condenser C is uncharged. At the time $t=t_0$ a positive voltage step of amplitude V is applied to the input. As appears from FIG. 1 no positive current can flow through the coil as long as the core is not in its positive saturated condition. However, as is well known, the flux cannot change abrupty from $-\Phi_s$ to $+\Phi_s$, but this process takes a time which is generally controlled by the relation $$n\Delta\Phi_s=\int_0^t v dt$$

where $v$ equals the constant voltage V, therefore $$2n\Phi_s=\int_{t_0}^{t_1} V dt=V(t_1-t_0)$$

This means that it takes the time $t_1-t_0=2n\Phi_s/V$ for the flux to run along the vertical axis in FIG. 1 from $-\Phi_s$ to $+\Phi_s$. During this time no charge can accumulate on condenser C so the output voltage remains zero. At the time $t_1$ the core reaches its positive saturation and henceforth offers only little resistance to the charging current. This gives rise to an oscillation during which condenser C is quickly charged and which may be understood by assuming that the reactor acts as an air coil having only small inductance $L_0$ and some ohmic resistance $r$. Thus the charging current wave takes the form of a damped sine wave:

$$i=\frac{V}{wL_0}e^{-at}\sin wt$$

in which $$w=\sqrt{\frac{1}{L_0C}-\frac{r^2}{4L_0^2}}$$

and $$a=\frac{r}{2L_0}$$

The condenser voltage $V_0$ is given by $$V_0=V\left[1-\left(\cos wt+\frac{a}{w}\sin wt\right)e^{-at}\right]$$

At the end of the first half wave, i.e. after a time $$\frac{\pi}{w}$$

the current again drops to zero and tends to reverse. It must however remain zero, until the core is again in its negative saturated state. Therefore such charge as will be acquired by the condenser at the end of said oscillation half wave, will be trapped and remain on said condenser until the flux has travelled along the vertical part of the characteristic (FIG. 1) to reach the negative saturation value $-\Phi_s$. When $i$ drops to zero the condenser will have been charged up to $$V\left[1+e^{\frac{-\pi a}{w}}\right]$$

This means that the condenser is not merely charged to the supply voltage but that there is a relative overshoot equal to $$\gamma=e^{-\frac{\pi a}{w}}=e^{-\frac{\pi\delta}{\sqrt{1-\delta^2}}};\ 0<\gamma<1$$

where $$\delta=\frac{1}{2}r\sqrt{\frac{C}{L_0}}$$

it will be seen that $\gamma$ depends only on circuit constants, and is independent of the voltage applied. This means that in a given circuit, whatever voltage step is applied, the relative overshoot will always be the same.

It will also be seen that the time taken for the charging of C:

$$\frac{\pi}{w}=\pi\sqrt{\frac{L_0C}{1-\delta^2}}$$

may be very short as long as $\delta$ is substantially smaller than 1, as in general $L_0$ is very small.

This explains the occurrence, at $t=t_1$, of a voltage step across the output. Between $t_1$ and $t_2$ the coil is subject to an inverse voltage of $\gamma$V volts. Accordingly, the flux will change from $+\Phi_s$ to $-\Phi_s$ at a slower rate which is $\gamma$ times the rate during the first magnetising stroke. At $t=t_2$ negative saturation is reached and this gives rise to another half period of oscillation, during which the condenser discharges into the input source; again the condenser voltage shoots over its mark and reaches $V(1-\gamma^2)$ at the end of the half wave.

In this way the condenser voltage continues to oscillate with steps of decreasing amplitude in alternate direction around the final value, successive steps being separated in time by intervals of ever increasing length. In fact, said step amplitudes constitute a descending geometrical progression and the intervals form an ascending geometrical progression in such a way that the successive positive and negative areas, as apparent from FIG. 5, are of substantially constant magnitude, viz. equal to $2n\Phi_s$.

Theoretically, said oscillation would go on for ever, in spite of the fact that energy is dissipated during each step. This may be explained by the fact that it has been assumed that no current is required to drive the core into saturation, which would mean that though the iron core is saturated, it stores no magnetic energy. In fact, in cores of permalloy and such like special materials, the magnetic energy may be small, but in practice it cannot be neglected altogether. So, in reality after a number of steps the electromagnetic energy contained in the ferroresonance circuit will have decreased to such an extent that it is no longer sufficient to drive the core into saturation. Henceforth, the reactor will behave as a more or less linear element of high—but not infinite—inductance value, and the remaining energy will be dissipated during a normal damped sine wave oscillation or rather during an exponential decay.

In order to make such a circuit suitable for producing a delayed output voltage of substantially constant amplitude it suffices to insert, in series with the reactor, a resistance R of a value at least sufficient to make $\delta=1$, consequently $\gamma=0$. Said resistance will have no influence on the magnetising phenomenon, as during the magnetising stroke the current is (almost) zero. However, as soon as saturation occurs, said resistance will limit the charging current and will dissipate part of the energy delivered by the source, so that the oscillation will be damped more heavily than before. If $\delta=1$ there will be no more overshoot and the circuit may be considered as critically damped. When at $t=t_1$ saturation occurs, the condenser merely charges to the level of the input voltage, and the circuit remains in this condition indefinitely.

Figure 5:
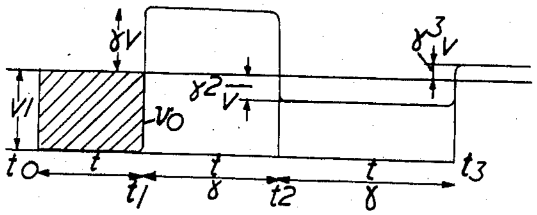
FIG. 5, shows the output from FIG. 3 in response to a square pulse input.

Thus, if a rectangular pulse is applied to the input of FIG. 3, the output pulse will have substantially the same waveform and amplitude but it will be shifted in time, with respect to said input pulse to such an extent that the area between both leading edges is equal to the volt-second integral required for driving the reactor from negative to positive saturation, as indicated in FIG. 5.

The resistance R used to achieve critical damping has in general a relatively low value. If it is desired to obtain an output pulse having the steepest edges possible, this low resistance value should not be exceeded. However, in order to achieve said steep edges, the input source must be able without prejudice to the pulse waveform, to supply and to absorb the large current surge needed to ensure rapid charging and discharging respectively, of the storage capacitor. If, on the contrary, very steep edges are not required, the necessity of providing large current surges may be obviated by increasing the resistance R beyond the minimum required for critical damping. The maximum damping resistance to be adopted may be determined by the requirement, that the storage capacitor should be fully charged before the end of the input pulse.

The current pulse delay circuit of FIG. 4 utilising a saturable capacitor operates as follows: supposing that the saturable capacitor SC is at its negative saturation point. When the current pulse source applies a current pulse, the voltage across the capacitor SC is negligibly small and cannot change substantially until sufficient charge has been added to the capacitor to take the latter to its positive saturation point. Since both said saturation points correspond to well defined charge values, the time required for this phase is determined by the current-time interval. As soon as the capacitor SC is positively saturated, its differential capacity drops to a very low value and the condenser voltage, which is applied to the linear inductance L in series with a (small) load resistance $1/GL$ rises rapidly.

An oscillation results, during which the current I2 flowing in the inductance L builds up rapidly.

If the oscillation were substantially undamped, the current I2 would not merely build up to the supply current I1, but there would be an overshoot depending on circuit constants. During the second half of the first half wave, the capacitor voltage again drops to zero and tends to reverse. It must however remain near zero until the capacitor is again in its negative saturation state. In order to reach that state a substantial amount of charge must be removed therefrom.

If now, due to a current overshoot, I2 is greater than I1, the difference will flow through the condenser whereby charge is being removed from it. However, if due to an adequate damping conductance G, the circuit is at least critically damped, there will be no overshoot and I2 will merely build up to the level of the input current. No charge will be removed from the saturable capacitor until the input current pulse ceases. At that moment I2 will be forced to flow through the capacitor whereby charge is removed from the latter at the same rate at which it had been supplied during the first part of the input current pulse. As soon as the capacitor again reached its negative saturated state the differential capacity drops to a very low voltage, so that another oscillation arises during which a high negative voltage peak is produced across the capacitor, while the current I2 drops rapidly. Again in this case, if the damping is adequate, there will be no current undershoot below zero, and the circuit will remain at rest after I2 has died down.

If a rectangular current pulse is applied to the input, the output pulse will have substantially the same waveform and amplitude but it will be shifted in time with respect to said input pulse to such an extent that the area between both leading edges is equal to the current-time-interval (= charge) required for driving the capacitor from negative to positive saturation. It will be noticed that the waveforms for the in- and output voltages are also valid for the in- and output currents.

In many cases more time is available for discharging the storage capacitor than for charging it. In such a case an arrangement, such as shown in FIG. 8 may be used, in which a rectifier RF is used to by-pass part R1 of the damping resistance in the direction of charging.

Figure 9:
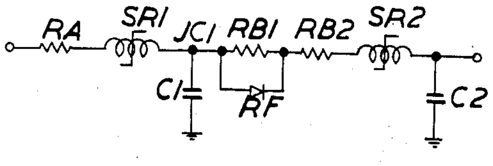
FIG. 9, shows the use of two delay circuits in series to obtain increased delay.

In circuits of the type shown in FIGS. 3 and 4, the output pulse must always start before the end of the input pulse. By using two or more such circuits in cascade, it is also possible to produce an output pulse which starts after the input pulse has ended. Such an arrangement is shown in FIG. 9. The first link, comprising saturable reactor SR1 and condenser C1 is at least critically damped by resistor RA. The second link comprises a first resistor RB1 shunted by rectifier RF, a second resistor RB2, saturable reactor SR2, and capacitor C2. It is supposed that both the cores of SR1 and SR2 start from negative saturation, and the core SR1 will reach positive saturation before the termination of the input pulse. Capacitor C1 then charges to the instantaneous input source voltage so that SR2 will be subjected to this voltage from $t1$ on, while SR1 is also subjected to said voltage as soon as the input pulse ends. It is further arranged that SR2 reaches its positive saturation after the termination of the input pulse. As soon as SR2 saturates, condenser C1 will partly discharge into C2. The values of RB1, RB2 are so determined that the damping for the direction of charging C2 is substantially below the critical value, while for the other direction the damping is at least critical.

Preferably, the resistance in the charging direction is as low as possible: for instance by by making $RB2=0$ said resistance will consist only of the resistance of the reactor winding and of rectifier RF. If C1 and C2 are equal, when C1 discharges into C2, the voltages on these capacitors change by an equal amount but in opposite directions. Due to the low damping in the second link, the discharge of C1 into C2 will not stop when both capacitors are at the same voltage, but an overshoot will result, leaving C2 at a voltage V volts higher than C1. C1 cannot completely discharge into C2, but is left with a voltage which appears across reactor SR1, so that the flux in the latter is still driven towards negative saturation, though at a slower rate. Thus both SR1 and SR2 are being driven towards negative saturation. By a judicious choice of the input pulse it may be arranged that both reactors will reach saturation substantially at the same instant, enabling both condensers C1 and C2 to discharge into the input source.

Figure 8:
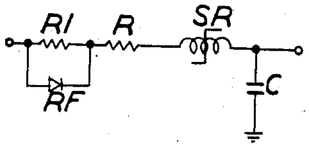

It will be understood that all circuits described above will operate in exactly the same way if the input pulses are negative instead of positive provided that in FIGS. 8 and 9 the rectifier is reversed. It will also be understood that it is by no means necessary that the input pulse is of rectangular shape, as the operation of the circuit depends only on its effective area.

The circuit of FIG. 3 or 4 might also be used for other applications than the one described, e.g. for detecting within a regular sequence of square pulses, a pulse of exceptionally long duration. This may be achieved by using a reactor which by the normally occurring square pulses will be driven just short of saturation, but will be driven into saturation whenever one of the pulses persist too long.

It is also possible to use two or more saturable reactors in series in each ferroresonant circuit, or to produce special effects by providing the reactor with one or more D.C. controlled premagnetising circuits. By using a pair of identical reactor cores having separate excitation windings and being tightly coupled by a common D.C. control winding, such as commonly used in magnetic amplifiers, as a simple saturable reactor, the voltsecond integral of which varies in function of the D.C. control current, a variable delay circuit is obtained, wherewith the delay time may be controlled or regulated in accordance with a D.C. current or voltage.

While the principles of the invention have been described above in connection with specific apparatus, it is to be clearly understood that this description is made only by way of example and not as a limitation on the scope of the invention.

I claim:

1. A pulse delay circuit for delaying the transmission of unidirectional electric pulses comprising: a pair of input and a pair of output terminals for said circuit; an inductive reactor connected in series between said pairs of terminals; a capacitive reactor connected effectively in shunt across one of said pairs of terminals, one of said reactors being of the saturable type; means including a load resistance attached to said output terminals acting in response to the application of a unidirectional pulse to said input terminals for saturating said saturable type reactor in first and second directions sequentially to produce oscillations having alternate steps of decreasing amplitude; a damping resistor connected in said circuit to damp said oscillations, the resistance value of said resistor being at least as great as the value required to produce critical damping of the oscillations after the second half cycle of the first oscillation of said oscillations.

2. A pulse delay circuit according to claim 1, wherein said inductive reactor is the reactor of the saturable type.

3. A pulse delay circuit according to claim 1, wherein said capacitive reactor is the reactor of the saturable type.

4. A pulse delay circuit according to claim 2, wherein said damping resistor is in series with said inductive reactor of the saturable type.

5. A pulse delay circuit according to claim 3, wherein said damping resistor is in shunt to the capacitive reactor of the saturable type.

6. A pulse delay circuit according to claim 1, wherein the resistance value of said damping resistor is greater than the value required to produce critical damping whereby the slope of the leading and lagging edges of said pulses is reduced as it passes through said circuit from said input to said output terminals.

7. A pulse delay circuit according to claim 2, further comprising a rectifier connected in shunt to a portion of said damping resistor to by-pass the charging current to said capacitive reactor to thereby compensate for difference in time to charge and the time to discharge said capacitive reactor.

References Cited in the file of this patent

UNITED STATES PATENTS

| | | |
|---|---|---|
| 2,713,675 | Schmitt | July 19, 1955 |
| 2,727,159 | Sunderlin | Dec. 13, 1955 |
| 2,802,119 | Timmel et al. | Aug. 6, 1957 |
| 2,851,616 | Thompson | Sept. 9, 1958 |
| 2,929,942 | Shepard | Mar. 22, 1960 |

FOREIGN PATENTS

| | | |
|---|---|---|
| 577,942 | Great Britain | June 6, 1946 |
| 154,760 | Australia | Feb. 1, 1951 |
| 752,883 | Great Britain | July 18, 1956 |